United States Patent [19]

Sakamoto et al.

[11] Patent Number: 4,794,628
[45] Date of Patent: Dec. 27, 1988

[54] COUNTER CIRCUIT WITH MISLATCHING PREVENTION

[75] Inventors: Keiji Sakamoto, Hachioji; Yukio Toyozawa, Kumamoto, both of Japan

[73] Assignee: Fanuc Ltd., Minamitsuru, Japan

[21] Appl. No.: 110,726

[22] PCT Filed: Mar. 3, 1987

[86] PCT No.: PCT/JP87/00136
§ 371 Date: Sep. 21, 1987
§ 102(e) Date: Sep. 21, 1987

[87] PCT Pub. No.: WO87/05453
PCT Pub. Date: Sep. 11, 1987

[30] Foreign Application Priority Data

Mar. 3, 1986 [JP] Japan .................. 61-045984

[51] Int. Cl.⁴ .................................... H03K 21/40
[52] U.S. Cl. ........................... 377/28; 377/2; 377/54
[58] Field of Search .................. 377/2, 28, 54

[56] References Cited

U.S. PATENT DOCUMENTS 4,433,426 2/1984 Forster ........................ 377/2
4,566,111 1/1986 Tanagawa .................... 377/28

Primary Examiner—John S. Heyman
Attorney, Agent, or Firm—Staas & Halsey

[57] ABSTRACT

A counter circuit for counting pulses inputted thereto asynchronously during a fixed period includes a counter 12' for counting the input pulses, a register 13 for storing pulses outputted by the counter 12' at fixed periods, and a control circuit 11' for generating a signal that controls the operating state of the counter 12' and register 13. When a signal that decides the operating period of the counter 12' is not being generated, namely between pulses indicative of the operating period, the counter 12' performs an ordinary counting operation. If an input pulse for counting is applied to the counter 12' during a period of time in which the abovementioned pulse is being generated, the control circuit 11' causes the counting operation to continue without clearing the counted value in the counter 12', after which the counted value in counter 12' is outputted to the register 13 to be latched therein, thereby preventing miscounting in the register 13.

4 Claims, 5 Drawing Sheets (* INDICATES NEGATIVE LOGIC)
; Active 1 = Low

| STATE | INPUT | | OUTPUT | | | |
|---|---|---|---|---|---|---|
| | SPup | SPdn | *LAT | *LD | ILD$_1$ | ILD$_2$ |
| S$_1$ | · | · | 0 | 0 | 0 | 0 |
| S$_2$ | · | · | 1 | 0 | 0 | 0 |
| S$_3$ | 0 | 0 | 0 | 1 | 0 | 0 |
| | 1 | 0 | | | 0 | 1 |
| | 0 | 1 | | | 1 | 1 |

{ · : don't care
{ * ; 1 = LOW (NEGATIVE LOGIC)

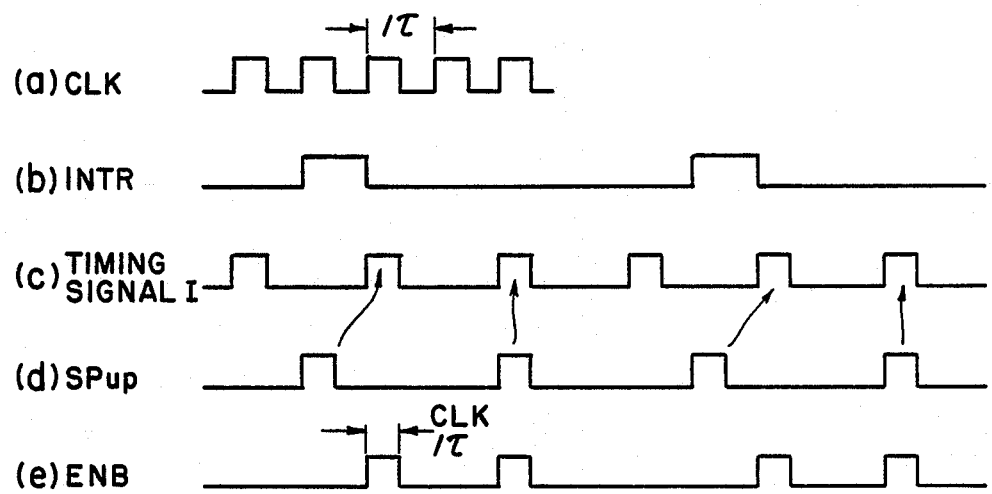

COUNTER CIRCUIT WITH MISLATCHING PREVENTION

BACKGROUND OF THE INVENTION

1. Field of the Invention

This invention relates to a counter circuit for counting pulses. More particularly, the invention relates to a counter circuit for counting pulses inputted thereto asynchronously during a fixed period.

2. Description of the Related Art

A numerically controlled machine tool uses many servomechanisms. A numerically controlled servomechanism has an electric motor for directly driving a machine. The electric motor is provided with a pulse coder which outputs pulses proportional to the momentary rotational velocity of the electric motor. This information is fed back to a control circuit so that the velocity of the electric motor may be controlled. In a servomechanism of this kind, the momentary detection of velocity by the pulse coder is performed by counting, by means of a counter circuit, the number of pulses outputted by the pulse coder. It has recently become possible to control the entire servomechanism by a microcomputer and digitize the overall circuitry. This has made it possible to use the counter circuit not only in velocity detection but also in many other areas, such as in circuits that calculate the difference between a commanded rotational velocity and a present rotational velocity.

The above-described counter circuit, which is illustrated in FIG. 6, is known and used conventionally in the art. This circuit will now be described. A synchronous circuit 10 establishes synchronism between input pulses APup or APdn and outputs synchronous pulses SPup or SPdn. The output synchronous pulses SPup on SPdn are input into a control circuit. When pulses INTR having a fixed period are inputted to the control circuit 11 from a timing circuit 14, an enable pulse ENB is output which actuates an up-down counter 12, which counts the number of pulses UP or DN from the control circuit 11. In response to the next application of the pulse INTR, the results of counting performed by the counter 12 thus far are stored in a register 13, and the counter C is cleared.

FIG. 7 is a timing chart associated with this counter circuit, and FIGS. 8 and 9 are timing charts illustrating the various signal waveforms of FIG. 7 in enlarged form. If the input pulses SPup shown in FIG. 7 include a pulse P which overlaps the pulse INTR, there is the danger that mislatching will occur when the register 13 is latched. FIG. 8 is an enlargement of the timing chart illustrated in FIG. 7.

In order to eliminate this drawback, a timing signal I is generated in synchronism with the pulse INTR and shifted in phase with respect thereto so as not to overlap INTR, as shown in FIG. 9. If any pulse SPup which overlaps the pulse INTR, as shown by the pulse P in FIG. 7, is generated, this pulse will be shifted up to the position of the timing signal I, as illustrated in FIG. 9, and the enable pulse ENB will be formed which has a timing such that it will not overlap the pulse INTR, as shown in FIG. 9(e). This pulse is counted. Thus, control is performed in the control circuit 11 in such a manner that mislatching does not occur. When this control is carried out, clock pulses CLK are frequency-divided a number of times to form the timing signal I. Accordingly, a problem that arises is that the frequency of the input pulses APup, APdn cannot be increased.

SUMMARY OF THE INVENTION

The present invention has been devised to solve the aforementioned problem encountered in the prior art. Accordingly, an object is to provide a counter circuit in which input pulses will not be mislatched to bring about a decline in counting precision.

Another object of the invention is to provide a counter circuit in which mislatching will not occur even if the input pulses are speeded up.

The present invention solves the problems encountered in the prior art by providing a counter circuit for counting input pulses inputted thereto asynchronously during a fixed period and storing the number of counted pulses in a register. The counter circuit comprises means for counting input pulses generated in a fixed period, means for generating a pulse to latch a value counted by the counting means in the register, clear the counting means and start the next counting period, means for causing the counting operation to continue without clearing the counted value when an input pulse is applied during generation of said pulse, thereby causing the input pulse to be counted, and means for latching the counted value in the register and clearing the counted value of the counting means after the input pulse is counted.

According to the present invention, if an input pulse is applied to the counter circuit during the generation of a pulse for latching the counted value from the counting means in the register and starting the operation which clears this counted value, the counting operation is caused to continue without clearing the counted value, after which the counted value is latched by the register. As a result, mislatching does not occur. Furthermore, since use is not made of a timing signal obtained by frequency-dividing a clock signal, as is done in the prior-art counter circuit, a counter circuit can be obtained in which the pulses can be processed at high speed.

BRIEF DESCRIPTION OF THE DRAWINGS

FIGS. 7 through 9 are timing diagrams showing the timing of input and output signals of various portions in the counter circuit of FIG. 6.

DETAILED DESCRIPTION OF THE PREFERRED EMBODIMENT

An embodiment of the invention will now be described with reference to the drawings.

Figure 1:
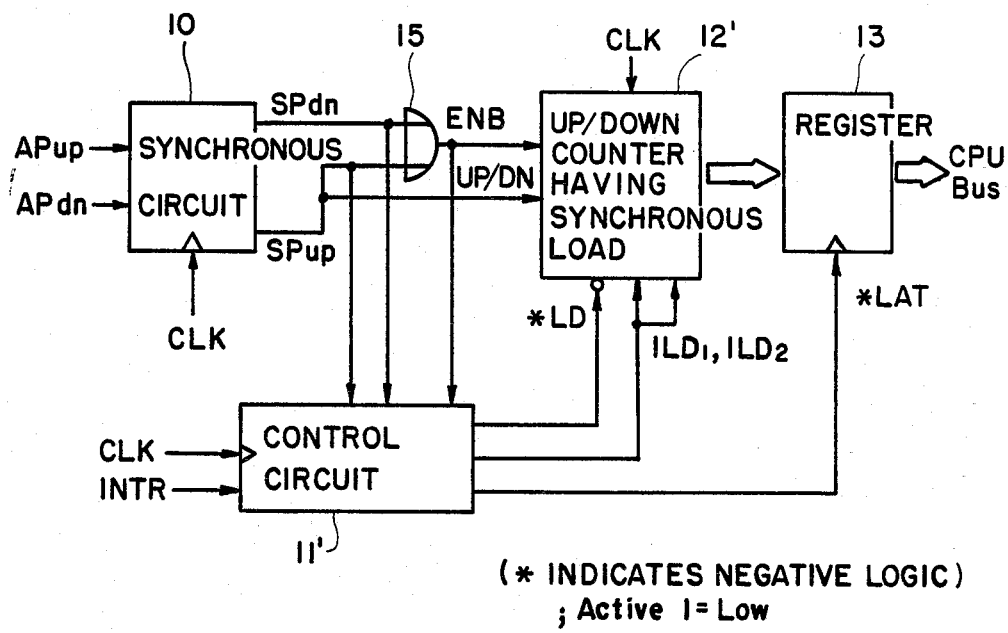
FIG. 1 is a block diagram illustrating the general construction of an embodiment of the invention.
Figure 2:
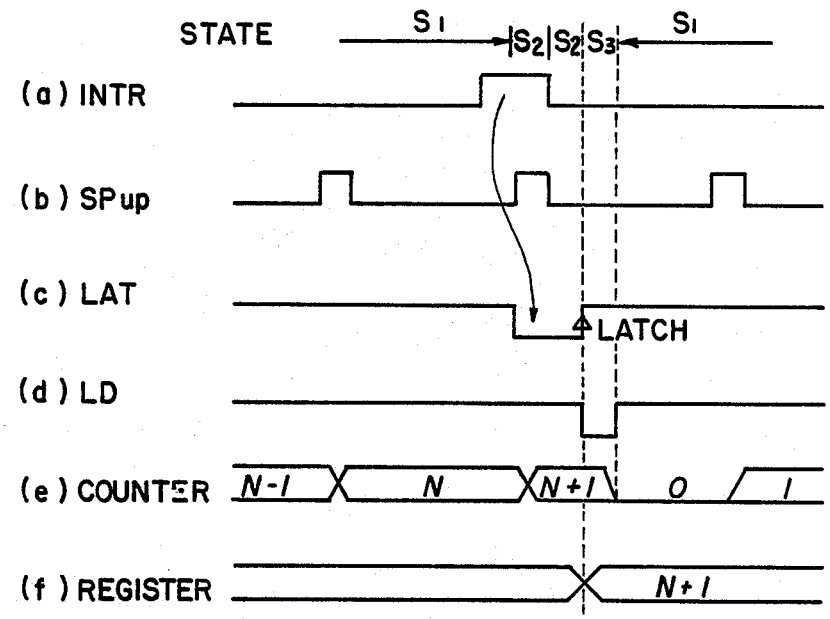
FIG. 2 is an operating timing diagram for the embodiment illustrated in FIG. 1.
Figures 3, 4:
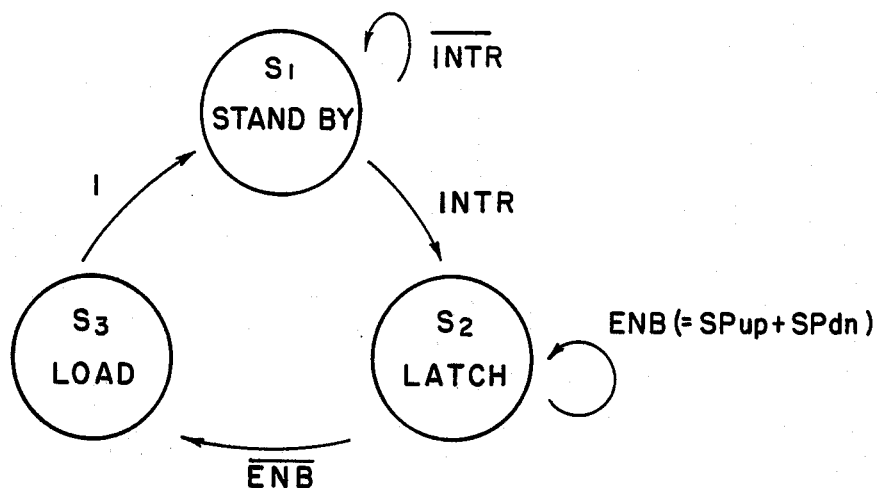
FIG. 3 is a diagram showing a transition in the state of a control circuit from FIG. 1.
FIG. 4 is a chart showing the relationship between the inputs and outputs of the control of FIG. 1.
Figure 5:
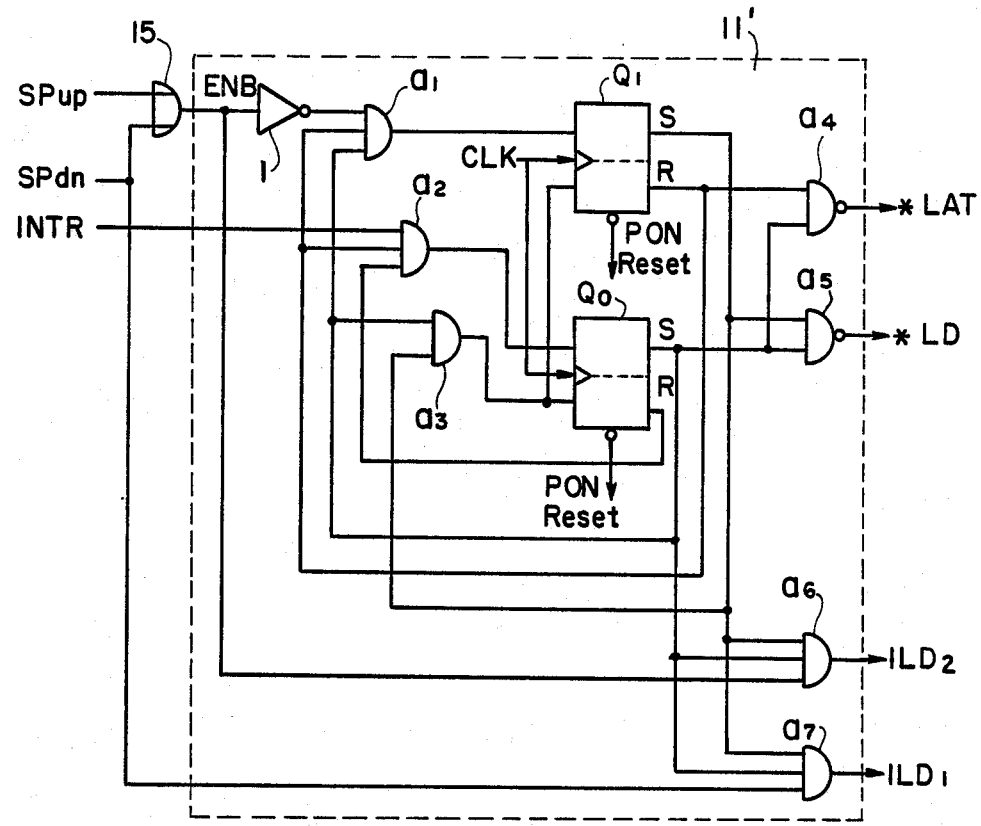
FIG. 5 is a structural explanatory view showing an embodiment of the control circuit of FIG. 1.

FIG. 1 is a block diagram illustrating a counter circuit according to the present invention. FIG. 2 is a timing diagram for the counter circuit of FIG. 1, FIG. 3 illustrates a transition in the state of a control circuit of FIG. 1, FIG. 4 is chart showing the relationship between inputs and outputs, and FIG. 5 is a circuit diagram of the control circuit of FIG. 1.

As shown in FIG. 1, the counter circuit of the invention comprises a synchronous circuit 10 identical to that of the conventional prior art circuit, an up/down counter 12' having a synchronous load, a register 13, a control circuit 11' for controlling the operation of the up/down counter 12 and register 13, and a gate circuit 15 using an OR gate for distributing pulses outputted by the synchronous circuit 10 to the up/down counter 12' and control circuit 11' and for forming a pulse up/down decision (enable) signal. If a sycnhronizing pulse up/dn from the synchronous circuit 10 is inputted to the counter 12' when the register 13 for storing the counted value has been set by a latch pulse *LAT, the counter 12' is preset by a load pulse *LD and load ILD1, ILD2 outputs are generated, whereby input pulses APup, APdn are counted even at a timing shifted from the leading and trailing edges of the clock pulse CLK. This makes it possible to realize high-speed processing of the input signals.

The operation of this counter circuit embodying the present invention will now be described with reference to FIGS. 2 and 3.

(1) The control circuit 11' maintains a state S1 when the pulse signal INTR, which determines the operating period, has not arrived. The state S1 indicates the completion of preparations for the counting of the input pulses by the counter circuit. At this time the output pulses *LAT ($=\overline{LAT}$), *LD ($=\overline{LD}$), ILD1, ILD2 from the control circuit 11' are 0, so that the presently prevailing state is maintained.

(2) In response to the pulse signal INTR being inputted to the control circuit 11', the state of the control circuit 11' changes from the state S1 (completion of preparations) to a state S2 (latch). The register 13 is set to the latch state by the latch pulse *LAT. If there is an input pulse SPup or SPdn at this time, the control circuit 11' maintains the presently prevailing state in response to the enable signal ENB, and the latch state continues.

(3) If neither the input pulse SPup or SPdn is applied, the control circuit 11' undergoes a transition from the latch state S2 to a state S3 (load) in response to the enable pulse $\overline{ENB}$ of negative logic from the OR circuit 15. At this time, the load pulse *LD is outputted, thereby presetting the counter 12'. In synchronism with the next clock pulse CLK, the load pulse *LD rises to 1 and the state of the control circuit 11' changes from the load state S3 to the state S1 (completion of preparations).

Thus, in accordance with the invention, rather than adopting the conventional method of using the timing signal I to prevent mislatching caused by overlapping of the input pulse INTR and enable pulse ENB, the latch pulse *LAT and load pulse *LD are controlled by the controlled circuit 11' to directly prevent mislatching of the register 13 caused by overlapping of the pulse signal INTR, which determines the period, and the enable signal ENB.

Figure 6:
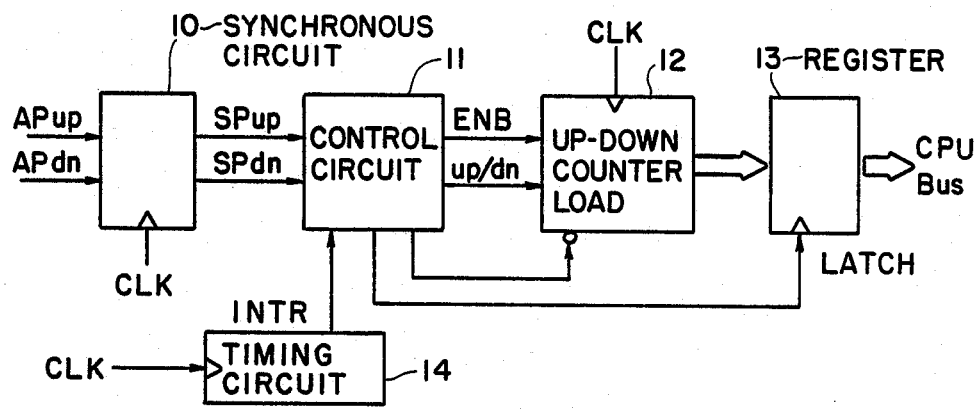
FIG. 6 is a block diagram showing an example of a conventional counter circuit.
Figure 7:
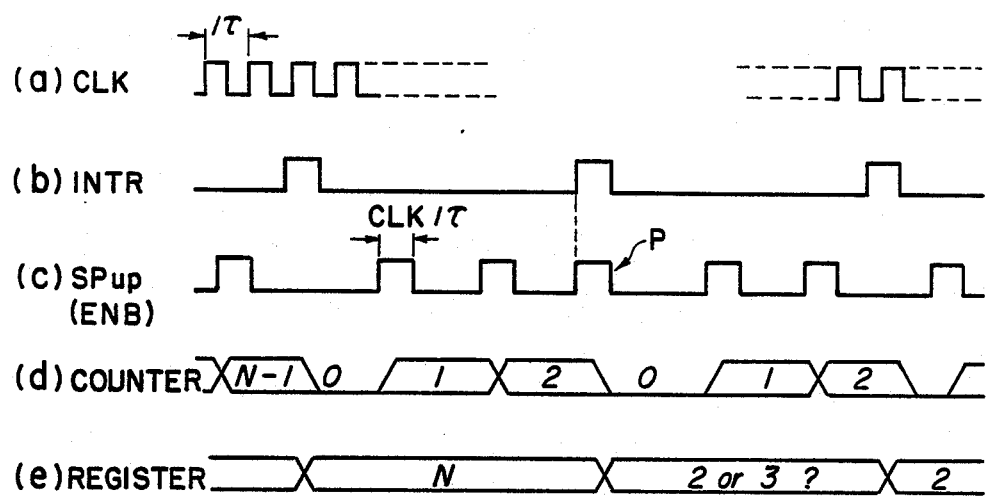
Figure 8:
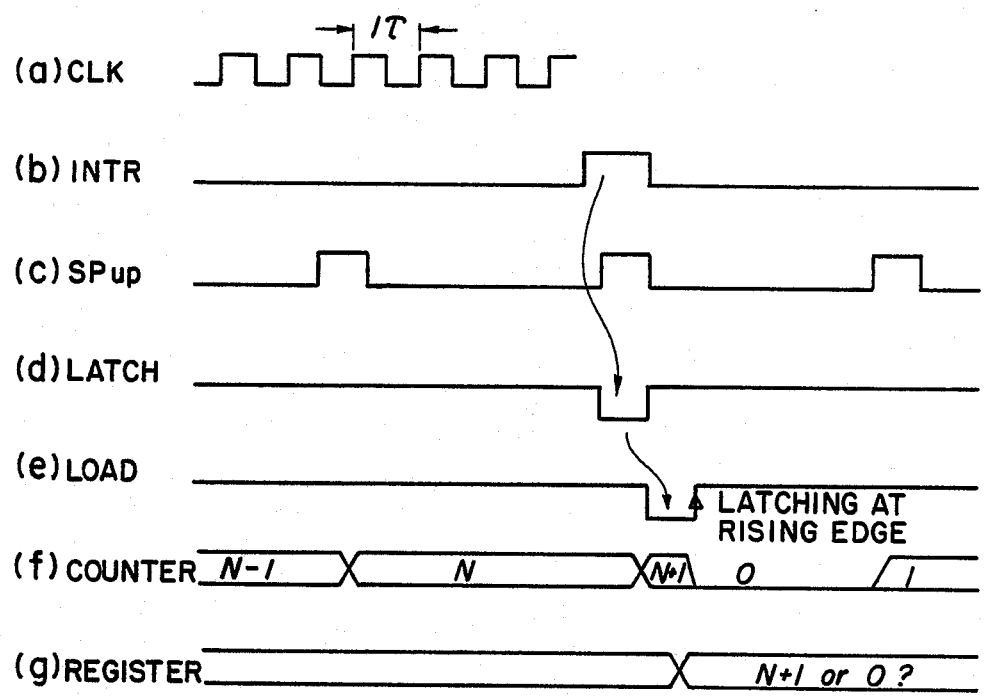

In contrast to the conventional circuit of FIG. 6, the counter circuit of the present invention shown in FIG. 1 is so arranged that the control circuit 11' outputs the load pulse *LD and loads ILD1, ILD2 to the counter 12' and outputs the latch pulse *LAT to the register 13. In addition, the up/down counter 12' is constructed as an up/down counter having a synchronous load. Furthermore, the gate circuit 15 is provided between the synchronous circuit 10 and the up/down counter 12'. The arrangement is such that when the synchronizing pulse SPup or SPdn is inputted, the enable signal ENB is outputted to the up/down counter 12'. The synchronizing pulses SPup and SPdn are also inputted to the control circuit 11'.

FIG. 5 illustrates a specific example of the construction of the control circuit 11' of the present embodiment. The details of the construction and the operation of the control circuit 11' will now be described based on the chart of FIG. 4, which shows the relationship between the inputs and outputs.

The input pulse SPup of SPdn applied to the gate circuit 15 as an up- or down-pulse becomes the enable signal ENB. The latter is supplied via an AND gate $a_1$ to the set side of a flip-flop $Q_1$ synchronized to the clock pulse CLK. The pulse signal INTR that determines the period of counting is supplied via an AND gate $a_2$ to the set side of a flip-flop $Q_1$ synchronized to the clock pulse CLK. The reset output of the flip-flop $Q_0$ is returned to the set side of the flip-flop $Q_0$ via the AND gate $a_2$, the reset output of the flip-flop $Q_1$ is returned to its own set side and the set side of the flip-flop $Q_0$ via the AND gates $a_1$ and $a_2$, respectively, and is outputted to an AND gate $a_4$. The set output of the flip-flop $Q_0$ is returned to the set sides of the flip-flop $Q_1$ and $Q_0$ via AND gates $a_1$, $a_3$, respectively, and is supplied to AND gates $a_4$, $a_5$ $a_6$, and $a_7$. The set output of $Q_1$ is returned to the reset sides of the flip-flops $Q_0$ and $Q_1$ via the AND gate $a_3$ and is delivered to the AND gates $a_5$, $a_6$ and $a_7$.

The AND gate $a_4$ outputs the latch pulse *LAT when Q1 and Q0 are both in the set state, and $a_5$ outputs the load pulse *LD when either Q1 or Q0 is in the set state. The loads ILD1, ILD2 are outputted in dependence upon the entry of the input pulses SPup and SPdn in this state.

In the above-described embodiment, the counter circuit is an up/down counter circuit. However, the invention is not limited thereto, for a counter that merely counts pulses can also be used.

Though the present invention has been described in some detail with regard to a preferred embodiment of a numerically controlled servo circuit, it is obvious that the disclosure of the preferred form may be modified in the details of construction, that various changes may be made without departing from the spirit of the invention as set forth in the claims, and that changes can be made in the combinations thereof.

The invention is not limited to use in a digitalized servo circuit but can be used in the technical fields of weighing and measurement, such as in a counter for counting frequency in the technical field of measurement or in a weighing circuit of a digital weighing system. It also goes without saying that the scope of application can be widened to include the technical field of communication.

We claim:

1. A counter circuit for counting input pulses inputted thereto asynchronously during a fixed period and storing the number of counted pulses in a register, comprising:
    means for counting input pulses generated during a fixed period;
    means for generating a first pulse to latch a value counted by said counting means in the register, to clear said counting means and to start a new fixed period;

means for causing the counting operation to continue without clearing said counted value from said counting means when an input pulse is applied during generation of said first pulse, so that said input pulse is counted; and means for latching the counted value in the register and clearing the counted value from said counting means after said input pulse is counted.

2. A counter circuit according to claim 1, wherein said counting means is an up/down counter.

3. A counter circuit according to claim 1, wherein said asynchronously inputted input signals are pulses from a numerically controlled servo circuit.

4. A counter circuit according to claim 2, wherein said asynchronously inputted input signals are pulses from a numerically controlled servo circuit.

* * * * *

UNITED STATES PATENT AND TRADEMARK OFFICE
CERTIFICATE OF CORRECTION

PATENT NO. : 4,794,628

DATED : December 27, 1988

INVENTOR(S) : Keiji Sakamoto et al.

It is certified that error appears in the above-identified patent and that said Letters Patent is hereby corrected as shown below:

Col. 1, line 51 "operlaps" s/b --overlaps--.

Col. 3, line 8 "12" s/b --12'--;

line 57 "controlled" s/b --control--.

Col. 4, line 19 "$Q_1$" s/b --$Q_0$--;

line 28 "$a_5\ a_6$" s/b --$a_5$, $a_6$--;

line 28 "Q1" s/b --$Q_1$--;

line 33 "Q1" s/b --$Q_1$--;

line 33 "Q0" s/b --$Q_0$--;

line 34 "Q1" s/b --$Q_1$--;

line 34 "Q0" s/b --$Q_0$--.

Signed and Sealed this

Thirteenth Day of June, 1989

Attest:

DONALD J. QUIGG

Attesting Officer

Commissioner of Patents and Trademarks